ns Patent Number: 4,985,647
Date of Patent: Jan. 15, 1991

United States Patent [19]
Kawada

[54] CMOS TRANSFER SWITCH FREE FROM MALFUNCTION ON NOISE SIGNAL

[75] Inventor: Shigeru Kawada, Tokyo, Japan

[73] Assignee: NEC Corporation, Tokyo, Japan

[21] Appl. No.: 369,532

[22] Filed: Jun. 21, 1989

[30] Foreign Application Priority Data

Jun. 21, 1988 [JP] Japan .................................. 63-154419

[51] Int. Cl.$^5$ ..................... H03K 19/94; H03K 17/687
[52] U.S. Cl. ..................................... 307/449; 307/573;
307/443; 307/547; 307/572; 307/463
[58] Field of Search ......................... 307/542, 547–549,
307/242–243, 571–573, 443, 449, 463

[56] References Cited

U.S. PATENT DOCUMENTS 4,752,704  6/1988  Baccarini et al. .................... 307/577

Primary Examiner—Stanley D. Miller
Assistant Examiner—M. Wambach
Attorney, Agent, or Firm—Helfgott & Karas

[57] ABSTRACT

An analog switch comprises first and second FET switches connected in series between input and output terminals through a first interconnection point, a third FET switch connected between the first interconnection point and one of power terminals, fourth and fifth FET switches connected in series between input and output terminals through a second interconnection point and a sixth FET switch connected between the second interconnection point and the other of the power terminals, whereby the first, second and sixth FET switches are simultaneously turns on or off in a manner that their operating conditions are kept in phase opposite to the third, fourth and fifth FET switches.

10 Claims, 3 Drawing Sheets

CMOS TRANSFER SWITCH FREE FROM MALFUNCTION ON NOISE SIGNAL

BACKGROUND OF THE INVENTION

1. Field of the Invention

The present invention relates to an analog switch circuit and, more particularly, to an analog switch circuit composed of a CMOS structure and being free from malfunction by external noise signal.

2. Related Art

A typical conventional analog switch circuit that is formed on a monolithic integrated circuit to be used in a multiplexer or the like employs a CMOS structure with a view to widening the input voltage range of analog signals.

FIG. 1 shows one example in which a conventional analog switch circuit is applied to a multiplexer.

This circuit has analog switch circuits $10_A$ to $10_M$ each comprising a pair of P- and N-type transistors $Q_{11}$ and $Q_{12}$ which are parallel-connected between the corresponding one of the input terminals $T_A$ to $T_M$ and an output terminal $T_O$ and which are respectively supplied at their gate electrodes with the corresponding one of the control signals $\phi_A$ to $\phi_M$ from a decoder 2 and an inverted signal formed by respective inverters $3_A$ to $3_M$ so that the analog switch circuits $10_a$ to $10_M$ turn on/off.

FIG. 2 shows a sectional structure of respective analog switch circuits $10_A$ to $10_M$. An $N^{31}$-type well region 12 is provided in a $P^-$-type semiconductor substrate 11. A P-type transistor $Q_{11}$ is formed in the well region 12 with P-type source and drain regions 13A and 14A and a gate electrode 16A, while an N-type transistor $Q_{12}$ is provided directly in the semiconductor substrate 11 with N-type source and drain regions 13B and 14B and a gate electrode 16B. The semiconductor substrate 11 is grounded through a substrate grounding electrode through a substrate grounding region 17, while the well region 12 is connected to a power supply potential ($V_{DD}$) terminal through the well-potential supplying region 15.

The above-described conventional analog switch circuits $10_A$ to $10_M$ are each comprised of a pair of P- and N-type transistors $Q_{11}$ and $Q_{12}$. The N-type transistor $Q_{12}$ of each of the analog switch circuits $10_A$ to $10_M$ is formed directly in the $P^-$-type semiconductor substrate 11 supplied with a grounding potential, while the P-type transistor $Q_{11}$ is formed in a well region 12 provided in the semiconductor substrate 11 and supplied with a power supply potential $V_{DD}$. Therefore, the conventional structure has the disadvantage that, if a noise or the like of a voltage which is out of the range defined by the power supply potential $V_{DD}$ and the ground potential is input to any of the input terminals $T_A$ to $T_M$, a current flows between the one of input terminals $T_A$ to $T_M$ and the power supply potential $V_{DD}$ terminal through the P-type source region 13A-the well region 12-the well potential supplying region 15 or the ground potential terminal through the N-type source region 13B-the substrate 11-the substrate grounding region 17. This current flow changes the channel potential of the transistor $Q_{11}$ or $Q_{12}$ so that the noise or the like is transmitted to the output terminal $T_O$, thus causing an adverse effect on the output signal OUT.

More specifically, it is assumed that a negative overvoltage is applied as a noise to the input terminal $T_A$ in the case where the control signal $\phi_A$ is at a high level and the transistors $Q_{11}$ and $Q_{12}$ of the analog switch circuit $10_A$ are in an off-state and therefore the input terminal $T_A$ and the output terminal $T_O$ are not in electrical connection with each other, while another control signal $\phi_B$ is at a low level and the transistors $Q'_{11}$ and $Q'_{12}$ of the analog switch $10_B$ are in an on-state and therefore the input terminal $T_B$ and the output terminal $T_O$ are in electrical connection with each other.

In such a case, if the negative overvoltage is applied to the source region $13_A$ through the input terminal $T_A$, since the gate electrode $16_A$ is at a high level, the transistor $Q_{11}$ is not turned on. However, if the negative overvoltage is applied to the source region $13_B$, a forward-biased diode is formed between the $P^-$-type semiconductor substrate 11 and the $N^+$-type source region $13_B$, so that the applied negative overvoltage causes a current to flow between the ground potential terminal and the input terminal $T_A$ through the substrate grounding electrode 17. Further, the transistor $Q_{12}$ which is turned off in the case where the gate electrode $16_B$ is at a low level, that is, a level substantially equal to the ground potential, and the gate-to-source voltage $V_{GS}$ of the transistor $Q_{12}$ is lower than the threshold voltage $V_{TH}$ is turned on since the source region $13_B$ is at a negative potential and hence the gate-to-source voltage $V_{GS}$ is higher than the threshold voltage $V_{TH}$ despite the fact that the potential at the gate electrode 16B is substantially equal to the ground potential. As a result, the negative overvoltage signal applied to the input terminal $T_A$ is undesirably transmitted to the output terminal $T_O$ through the analog switch circuit $10_A$ which has been set in an off state, thus causing an adverse effect on the output signal OUT.

When a positive overvoltage which is higher than the power supply voltage $V_{DD}$ is applied as a noise to the input terminal $T_A$, the transistor $Q_{11}$ is turned on in reverse to the above, thus similarly causing an adverse effect on the output signal $T_O$.

SUMMARY OF THE INVENTION

It is an object of the present invention to provide an analog switch circuit wherein, when the connection between an input terminal and an output terminal is set in an off-state in response to a control signal, this off-state is maintained even if an overvoltage noise or the like which is out of the range defined between the power supply potential and the ground potential, is applied to the input terminal, thus preventing the noise or the like from being transmitted to the output terminal.

The analog switch circuit according to the present invention comprises: first and second transistors of one conductivity type which are series-connected between an input terminal and an output terminal to turn on/off in response to a control signal mutually input to their gate electrodes, thereby closing or opening the circuit between the input and output terminals; a third transistor connected between the node of the series connection of the first and second transistors and a ground potential terminal (or a power supply potential terminal) to perform an on/off operation which is opposite to the on/off operation of the first and second transistors in response to the control signal; fourth and fifth transistors of the opposite conductivity type to said conductivity type which are series-connected between the input and output terminals to turn on/off in response to an inverted signal formed by inverting the control signal, the inverted signal being mutually input to the gate electrodes of the fourth and fifth transistors, thereby closing or opening the circuit between the input and output terminals in synchronism with the first and second transistors; and a sixth transistor connected between the node of the series connection of the fourth and fifth transistors and the power supply potential terminal (or the ground potential terminal) to perform an on/off operation which is opposite to the on/off operation of the fourth and fifth transistors in response to the control signal.

BRIEF DESCRIPTION OF THE DRAWING

The above and further objects and features of the invention will appear from the following description in which the preferred embodiments are set forth in conjunction with the accompanying drawings.

DETAILED DESCRIPTION OF THE PREFERRED EMBODIMENTS

Embodiments of the present invention will next be described with reference to the drawings.

Figure 3:
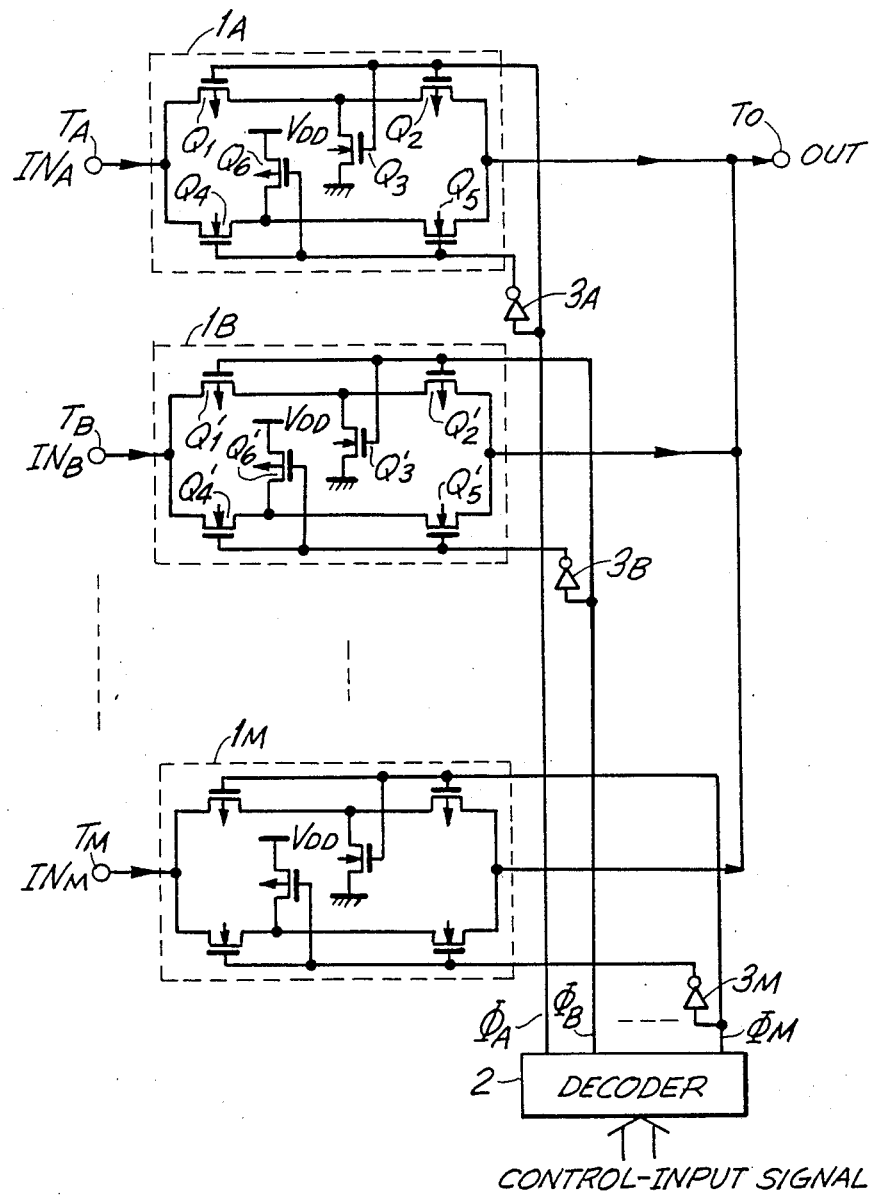
FIG. 3 is a circuit diagram showing a first embodiment of the present invention.

FIG. 3 is a circuit diagram of a multiplexer in which an analog switch circuit according to a first embodiment of the present invention is used.

Each of the analog switch circuits $1_A$ to $1_M$ in this embodiment comprises a pair of P-type first and second transistors $Q_1$ and $Q_2$ which are series-connected between the corresponding one of the input terminals $T_A$ to $T_M$ and an output terminal $T_O$ and mutually supplied at their gate electrodes with the corresponding one of the control signals $\phi_A$ to $\phi_M$ to turn on/off in response to the corresponding control signal ($\phi_A$ to $\phi_M$) so as to close or open the circuit between the corresponding input terminal ($T_A$ to $T_M$) and the output terminal $T_O$, an N-type third transistor $Q_3$ which is connected between the node of the series connection between the transistors $Q_1$, $Q_2$ and a ground potential terminal and which is supplied at its gate electrode with the corresponding control signal ($\phi_A$ to $\phi_M$) to perform an on/off operation which is opposite to the on/off operation of the first and second transistors $Q_1$ and $Q_2$ in response to said control signal, a pair of N-type fourth and fifth transistors $Q_4$ and $Q_5$ which are series-connected between the corresponding input terminal ($T_A$ to $T_M$) and the output terminal $T_O$ and which are mutually supplied at their gate electrodes with an inverted signal formed by inverting the corresponding control signal ($\phi_A$ to $\phi_M$) through the corresponding one of the inverters $3_A$ to $3_M$ to turn on/off in response to said inverted signal so as to close or open the circuit between the corresponding input terminal ($T_A$ to $T_M$) and the output terminal $T_O$ in synchronism with the transistors $Q_1$ and $Q_2$, and a P-type sixth transistor $Q_6$ which is connected between the node of the series connection of the fourth and fifth transistors $Q_4$, $Q_5$ and a power supply potential $V_{DD}$ terminal and which is supplied at its gate electrode with the inverted signal, that is, a signal formed by inverting the corresponding one of the control signal $\phi_A$ to $\phi_M$ through the corresponding one of the inverters ($3_A$ to $3_M$), to perform an on/off operation which is opposite to the on/off operation of the fourth and fifth transistors $Q_4$ and $Q_5$ in response to the inverted signal.

It should be noted that a decoder 2 outputs the control signals $\phi_A$ to $\phi_M$ for selectively turning on/off the analog switch circuits $1_M$ to $1_M$ in response to a control-input signal.

The operation of this embodiment will next be explained.

When the control signal $\phi_A$ is at a low level, the transistors $Q_1$, $Q_2$, $Q_4$ and $Q_5$ are turned on, while the transistors $Q_3$ and $Q_6$ are turned off, so that the input terminal $T_A$ and the output terminal $T_O$ are electrically connected together through the transistors $Q_1$, $Q_2$, $Q_4$ and $Q_5$, that is, the circuit path between the input terminal $T_A$ and the output terminal $T_O$ is closed.

When the control signal $\phi_A$ is at a high level, the transistors $Q_1$, $Q_2$, $Q_4$ and $Q_5$ are turned off, while the transistors $Q_3$ and $Q_6$ are turned on, so that the circuit path between the input terminal $T_A$ and the output terminal $T_O$ is opened, that is, these input and output terminals are not in electrical connection with each other.

At this time, the node of the series connection between the transistors $Q_1$ and $Q_2$ is connected to the ground potential terminal through the transistor $Q_3$ which is in an on-state, while the node of the series connection between the transistors $Q_4$ and $Q_5$ is connected to the positive power supply potential $V_{DD}$ terminal through the transistor $Q_6$ which is in an on-state.

Therefore, if the control signal $\phi_A$ is at a high level, while the control signal $\phi_B$ is at a low level, then a signal $IN_B$ which is input to the input terminal $T_B$ is transmitted to the output terminal $T_O$.

It is assumed that in this state a positive overvoltage which is higher than the power supply potential $V_{DD}$ is applied as a noise or the like to the input terminal $T_A$.

Figure 1:
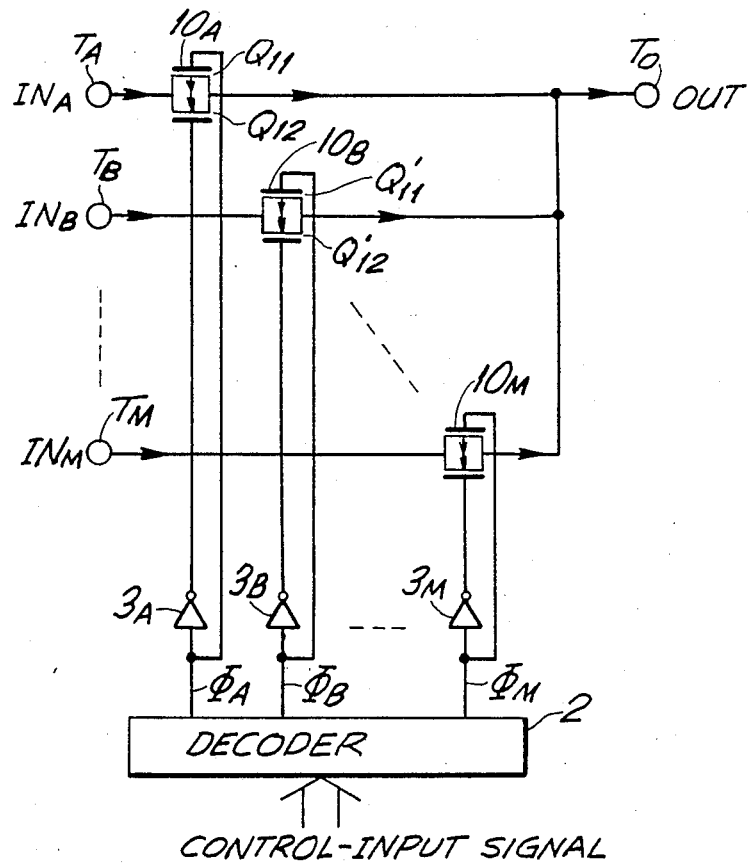
FIG. 1 is a circuit diagram showing a multiplexer using conventional analog switch circuits.
Figure 2:
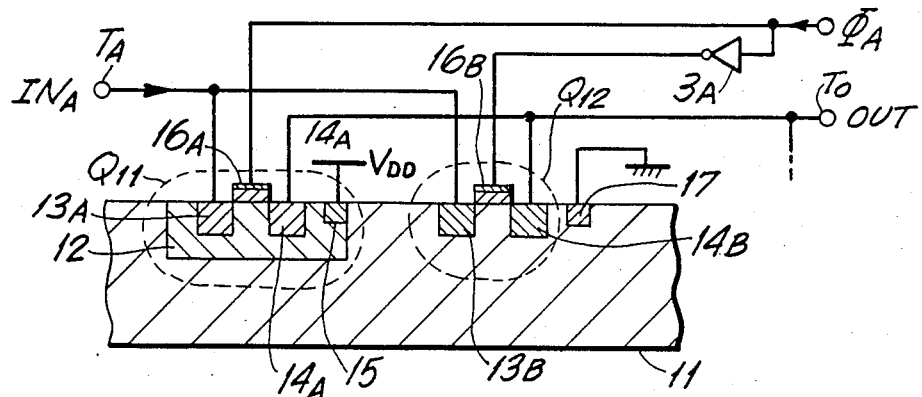
FIG. 2 is a sectional diagram showing an analog switch circuit used in the prior art and embodiments of the present invention.

Since the group of transistors $Q_1$, $Q_2$, $Q_6$ and the group of transistors $Q_3$ to $Q_5$ respectively have structures which are similar to those of the transistors $Q_{11}$ and $Q_{12}$ shown in FIG. 2, the positive overvoltage applied to the input terminal $T_A$ causes the P-type source region of the transistor $Q_1$ within the N-well which is connected to the power supply potential $V_{DD}$ terminal to rise above the power supply potential $V_{DD}$. As a result, a forward-biased PN junction is formed by the source region and the well region and the overvoltage applied to the input terminal $T_A$ causes a current to flow to the power supply potential $V_{DD}$ terminal through the well region. Since the transistor $Q_1$ is supplied at its gate electrode with the control signal $\phi_A$ which is at a high level, that is, a level substantially equal to the power supply potential $V_{DD}$, the transistor $Q_1$ should be in an off-state. However, since the overvoltage applied to the source region causes the absolute value of the gate-to-source voltage $V_{GS}$ to become greater than the threshold voltage $V_{TH}$, the transistor $Q_1$ turns on and a current path is formed between the source and drain regions of the transistor $Q_1$.

However, since the node of the series connection between the transistors $Q_1$ and $Q_2$ is connected to the ground potential terminal through the transistor $Q_3$ which is in an on-state, the positive overvoltage transmitted through the transistor $Q_1$ is absorbed here and has no effect on the transistor $Q_2$ that is series-connected to the transistor $Q_1$. Thus, the overvoltage applied to the input terminal $T_A$ is not transmitted to the output terminal $T_O$ at all.

Since the transistor $Q_4$ is different from the transistor $Q_1$ in terms of the conductivity type, that is, it is of the N-type, no problem such as that described above arises. Even if the source and drain regions of the transistor $Q_4$ causes a punch-through phenomenon, since the node of the series connection between the transistors $Q_4$ and $Q_5$ is connected to the power supply potential $V_{DD}$ terminal through the transistor $Q_6$ which is in an on-state, the positive overvoltage applied through the transistor $Q_4$ is absorbed here and has no effect on the transistor $Q_5$. Thus, the overvoltage applied to the input terminal $T_A$ is not transmitted to the output terminal $T_O$ through this path, either.

On the other hand, when a negative overvoltage is applied to the input terminal $T_A$, the transistor $Q_1$ has no problem in reverse to the above. However, the potential at the N-type source region of the transistor $Q_4$ formed directly in the P-type semiconductor substrate which is connected to the ground potential terminal becomes lower than the ground potential, so that this PN junction is forward-biased. As a result, the negative overvoltage applied causes a current to flow to the ground potential terminal through the semiconductor substrate.

Accordingly, the transistor $Q_4$ which should be in an off-state turns on. However, since the node of the series connection between the transistors $Q_4$ and $Q_5$ is connected to the power supply potential $V_{DD}$ terminal through the transistor $Q_6$ which is in an on-state, the negative overvoltage which is applied to the input terminal $T_A$ and transmitted through the transistor $Q_4$ is absorbed here and not transmitted to the transistor $Q_5$ and the output terminal $T_O$.

Since the transistor $Q_1$ is different from the transistor $Q_4$ in terms of the conductivity type, that is, it is of the P-type, no problem such as that described above arises. Even if the source and drain regions of the transistor $Q_1$ causes a punch-through phenomenon, the negative overvoltage applied is absorbed through the transistor $Q_3$ and has no effect on the output signal OUT.

Thus, even if a positive or negative overvoltage which is out of the range defined by the power supply potential and the ground potential is applied to the input terminal $T_A$ of the analog switch circuit $1_A$ which is in an off-state, there is no effect on the output terminal $T_O$ of the multiplexer and the signal $IN_B$ which is applied to the input terminal $T_B$ of the analog switch circuit $1_B$ which is in an on-state is output without being affected by the overvoltage applied to the input terminal $T_A$.

Figure 4:
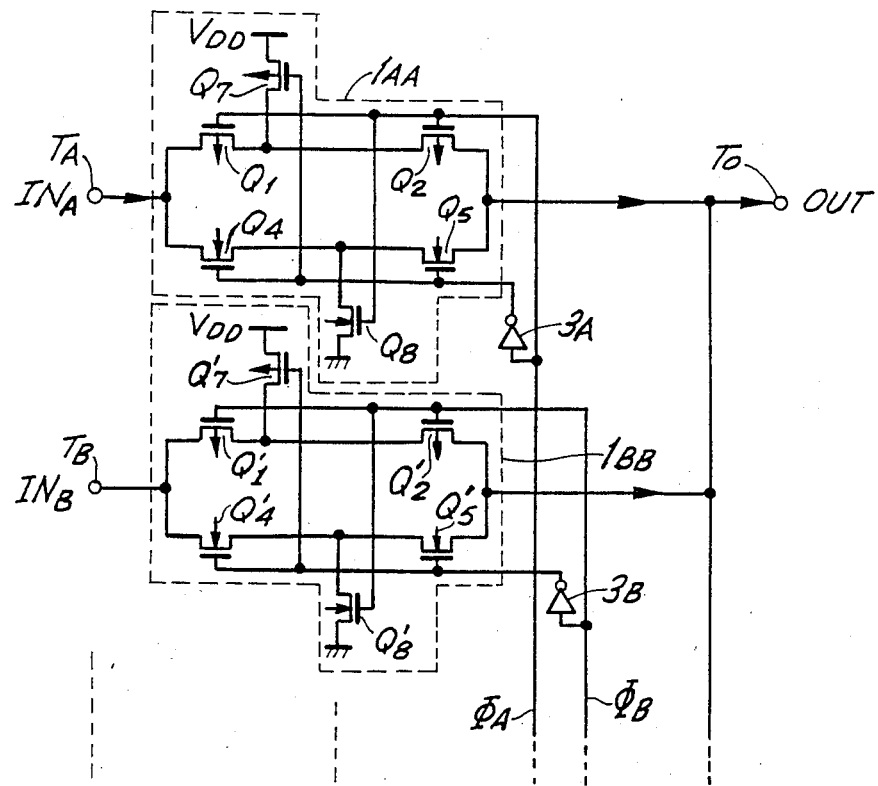
FIG. 4 is a circuit diagram showing a second embodiment of the present invention.

FIG. 4 is a circuit diagram of a multiplexer to which an analog switch circuit according to a second embodiment of the present invention is applied.

The analog switch circuits $1_{AA}$ and $1_{BB}$ of the second embodiment differ from the analog switch circuits $1_A$ to $1_M$ of the first embodiment in that a P-type third transistor $Q_7$ is provided between the node of the series connection between the transistors $Q_1$, $Q_2$ and the power supply potential $V_{DD}$ terminal, the third transistor $Q_7$ being supplied at its gate electrode with an inverted signal formed by inverting the corresponding control signal ($\phi_A$, $\phi_B$) to perform an on/off operation which is opposite to the on/off operation of the first and second transistors $Q_1$ and $Q_2$ and an N-type sixth transistor $Q_8$ is provided between the node of the series connection of the fourth and fifth transistors $Q_4$, $Q_5$ and the ground potential terminal, the sixth transistor $Q_8$ being supplied at its gate electrode with the corresponding control signal ($\phi_A$, $\phi_B$) to perform an on/off operation which is opposite to the on/off operation of the fourth and fifth transistors $Q_4$ and $Q_5$.

The operation of the analog switch circuits $1_{AA}$ and $1_{BB}$ is substantially similar to that of the analog switch circuits $1_A$ to $1_M$ according to the first embodiment. However, since transistors which are of the same conductivity type are connected together, i.e., the transistors $Q_1$, $Q_2$ and $Q_7$ all of which are of the P-type are connected together, and the transistors $Q_4$, $Q_5$ and $Q_6$ all of which are of the N-type are connected together, the second embodiment has the advantage that it is possible to reduce the layout area in comparison with the first embodiment.

It should be noted that, if the flow of signals in these embodiments are reversed, the foregoing multiplexers can be used as demultiplexers and, in such a case also, it is possible to obtain advantageous effects similar to those in the foregoing embodiments.

Further, the analog switch circuit according to the present invention may be applied to a wide range of uses in addition to the above-described use application. For example, if the present invention is applied to the sampling portion of a sample-and-hold circuit, it is possible to prevent the level of a signal held from being adversely affected by an overvoltage noise or the like which is applied to the input terminal.

As has been described above, according to the present invention, two series-connected P-type transistors and two series-connected N-type transistors, which turn on-off in synchronism with each other in response to a control signal, are connected between an input terminal and an output terminal, and two transistors are respectively provided between the node of the series connection of the P-type transistors and either one of the two terminals, that is, a ground potential terminal and a power supply potential terminal, and between the node of the series connection of the N-type transistors and the other of the two terminals, these two transistors performing an on/off operation which is opposite to that of the P- and N-type transistors in response to the control signal. Thus, even if an overvoltage noise or the like which is out of the range defined by the power supply potential and the ground potential is input to the input terminal when the input and output terminals are placed in a non-conducting state by the control signal, since the transistors that are respectively provided between the nodes of the series connection of the P- and N-type transistors on the one hand and the ground potential terminal and the power supply potential terminal on the other are in an on-state, the overvoltage noise or the like applied to the input terminal is prevented from being transmitted to the output terminal, so that it is possible to eliminate adverse effects on the output signal.

I claim:

1. An analog switch circuit comprising a control signal generator producing a control signal and an inverted control signal formed by inverting said control signal; and input terminal receiving an input signal; an output terminal; first and second transistors of one conductivity type having gate electrodes and forming a first series-connection connected between said input terminal and said output terminal to turn on/off in response to said control signal mutually applied to said gate electrodes, thereby controlling a transfer of said input signal between said input and output terminals; a third transistor connected between an interconnection node of said first and second transistors and one of a ground potential terminal and a power supply potential terminal and having a gate electrode receiving said control signal to perform an on/off operation which is opposite to the on/off operation of said first and second transistors in response to said control signal; fourth and fifth transistors of the conductivity type opposite to said one conductivity type and having gate electrodes and forming a second series connection connected between said input and output terminals to turn on/off in response to said inverted control signal, said inverted control signal being mutually applied to the gate electrodes of said fourth and fifth transistors, thereby controlling a transfer of said input signal between said input and output terminals in synchronism with said first and second transistors; and a sixth transistor connected between an interconnection node of said fourth and fifth transistors and another of said ground potential terminal and said power supply potential terminal to perform an on/off operation which is opposite to the on/of operation of said fourth and fifth transistors in response to said control signal.

2. An analog switch circuit as claimed in claim 1, wherein said third transistor is of said opposite conductivity type and is connected between said interconnection node of said first and second transistors and said ground potential terminal and said sixth transistor is of said one conductivity type and is connected between said interconnection node of said fourth and fifth transistors and said power supply potential terminal.

3. An analog switch circuit as claimed in claim 2, wherein said control signal is applied to said gate electrodes of said first, second and third transistors and said inverted control signal is applied to said gate electrodes of said fourth, fifth and sixth transistors.

4. An analog switch circuit as claimed in claim 1, wherein said third transistor is of said one conductivity type and is connected between said interconnection node of said first and second transistors and said power supply potential terminal and said sixth transistor is of said opposite conductivity type and is connected between said interconnection node of said fourth and fifth transistors and said ground potential terminal.

5. An analog switch circuit as claimed in claim 4, wherein said control signal is applied to said gate electrodes of said first, second and sixth transistors and said inverted control signal is applied to said gate electrodes of said third, fourth, and fifth transistors.

6. A switch circuit comprising:
an input terminal;
an output terminal;
first and second power terminals for supplying a power therefrom;
first and second switches connected in series between said input and output terminals through a first interconnection point;
a first control means for controlling said first and second switches to simultaneously turn said first and second switches on or off;
a third switch connected between said first interconnection point and one of said first and second power terminals;
a second control means for controlling said third switch so as to turn said third switch on or off in a manner that an on or off condition of said third switch is opposite to that of said first and second switches;
fourth and fifth switches connected in series between said input and output terminals through a second interconnection point;
a third control means for controlling said fourth and fifth switches to simultaneously turn said fourth and fifth switches on or off in a manner that on or off conditions of said fourth and fifth switches are the same as those of said first and second switches;
a sixth switch connected between said second interconnection point and another of said first and second power terminals; and
a fourth control means for controlling said sixth switch to turn said sixth switch on or off in a manner that an on or off condition of said sixth switch is opposite to that of said first and second switch.

7. A switch circuit as claimed in claim 6, wherein said first, second and sixth switches are field effect transistors of one channel type, while said third, fourth and fifth switches are field effect transistors of the other channel type.

8. A switch circuit as claimed in claim 7, wherein said first, second and third switches are controlled by a first control signal and said fourth, fifth and sixth switches are controlled by a second control signal which is opposite in phase to said first control signal.

9. A switch circuit as claimed in claim 6, wherein said first, second and third switches are field effect transistors of one channel type, while said fourth, fifth and sixth switches are field effect transistors of the other channel type.

10. A switch circuit as claimed in claim 9, wherein said first, second and sixth switches are controlled by a first control signal, and said third, fourth and fifth switches are controlled by a second control signal which is opposite in phase to said first control signal.

* * * * *